United States Patent [19]

Rostek et al.

[11] 4,109,296
[45] Aug. 22, 1978

[54] MACHINE INSERTABLE CIRCUIT BOARD ELECTRONIC COMPONENT

[75] Inventors: Paul M. Rostek, San Diego; John F. Baeyertz, Escondido, both of Calif.

[73] Assignee: NCR Corporation, Dayton, Ohio

[21] Appl. No.: 820,655

[22] Filed: Aug. 1, 1977

[51] Int. Cl.² ............................................. H05K 1/04
[52] U.S. Cl. .................................. 361/401; 361/303; 361/306
[58] Field of Search ............... 361/401, 406, 301, 302, 361/303, 306, 308, 309, 310; 174/52 P, 52 PE; 338/317; 339/17 C, 17 R

[56] References Cited

U.S. PATENT DOCUMENTS

| 2,892,130 | 6/1959 | Kilby | 361/406 |
| 2,990,498 | 6/1961 | Evans | 361/401 |
| 3,061,816 | 10/1962 | Reynolds | 361/401 |
| 3,219,886 | 11/1965 | Katzin | 361/401 |
| 3,524,960 | 8/1970 | Lohff | 339/17 C |

Primary Examiner—David Smith, Jr.

Attorney, Agent, or Firm—J. T. Cavender; Edward Dugas

[57] ABSTRACT

A circuit board component, specifically a capacitor, which is configured to be machine insertable into apertures of a circuit board. The component is a cylindrical element having at least two recessed sectors in the outer surface of the cylindrical element which recessed surfaces are provided with an electrically conductive material. The conductive material either forms a part of the component such as capacitor plates and/or provides a contact surface for the connecting of an internally-mounted electrical component. An indexing means positioned on the one end of the cylindrical element provides a means whereby an automatic insertion machine can by indexing insure the correct orientation of the component with regard to corresponding electrical contacts on the circuit board. A flange extending from one end of the cylindrical element provides a stop in order to limit the travel of the component within the circuit board aperture when inserted by automatic means.

7 Claims, 5 Drawing Figures

MACHINE INSERTABLE CIRCUIT BOARD ELECTRONIC COMPONENT

CROSS REFERENCE TO RELATED APPLICATIONS

The present application is related to U.S. Pat. application Ser. No. 820,654 entitled "Solderless Circuit Board Component" and which application was filed on even date herewith.

BACKGROUND OF THE INVENTION

In the manufacture of electronic circuitry of the type which utilizes circuit boards having discrete devices such as capacitors mounted thereon, it has been found to be highly advantageous to eliminate manual insertion techniques, as such techniques are expensive and subject to operator error. Alternate techniques directed to the automatic placement of parts are more desirable in that they decrease costs and reduce the number of errors that are normally committed in the fabrication of the circuit board. Electrical components which have leads also have lead inductance. Such inductance causes limitations in signal handling capabilities of a circuit using such components. It would therefore be highly desirable to have an electrical component that requires no leads. Once the desirability of automatic handling of the insertion and fastening of discrete components to the circuit board is decided upon, then the problems associated with handling the particular discrete component becomes acute. Some of the problems are of course the physical design of the component such that the fabricating machine can index the component in the correct polarity and/or angular relationship with respect to the conductors on the circuit board and also in the physical transportation of the component from the parts bin to the circuit board under fabrication. In addition, there also exists the problem associated with the handling of different size discrete components. A number of configurations have been proposed for facilitating the automatic placement of electronic components on circuit boards. One such configuration is disclosed in U.S. Pat. No. 2,990,498 entitled "Capacitor" by S. W. Evans. The component disclosed is a capacitor which is particularly adaptable to being inserted into a circuit board. More specifically, there is disclosed a capacitor which is trapezoidal in shape and which is formed from a dielectric material having electrical plates positioned on either side of the dielectric material. The capacitor is designed to be inserted edgewise into a rectangular hole in the circuit board. With such a mounting the electrical plates are forced into electrical contact with corresponding conductors on the circuit board and are soldered to the circuit board to provide a rigid support for the capacitor component. It is to be noted, that the opening into which the component is to be inserted is by necessity rectangular in shape. Rectangular holes are more difficult to cut than are circular holes.

Another patent of interest is U.S. Pat. No. 3,142,783, entitled "Electrical Circuit System" by W. B. Warren wherein there is disclosed a circuit board having a hole drilled there through for receiving an electrical component which component is cylindrical in shape. Each end of the cylindrical shaped component and/or housing for a component has an electrical conductor affixed thereto for making contact with electrical conductors on the circuit board. One end of the hole in the circuit board is provided with tabs that project into the opening area so as to limit the travel of the component when it is inserted into the circuit board. For the particular configuration of the electrical component shown, the conductors are positioned on each end of the cylindrically-shaped element. This limits the number of electrical contacts that the component may be physically connected to in terms of a multi-layer device, that is, only the board conductors that are in the plane of the two end conductors can be physically in contact with the two end conductors. In addition, the circuit board must be provided with an additional layer which layer contains the indexing and/or stop tabs for the electrical component.

Another device of interest is disclosed in U.S. Pat. No. 3,218,584 entitled "Strip Line Connection" by D. R. Ayer. The device disclosed in the subject patent is one which can make contact to a multi-layer printed circuit board in that multi-layers of the component are provided which layers and associated contacts are designed to come into contact with associated circuit board layers when the component is fully inserted in the board. It is to be noted that the device is rectangular and/or square in shape and the receiving holes in the circuit board also must be formed as either rectangles or squares making the fabrication process somewhat difficult.

Another pertinent prior art reference is U.S. Pat. No. 3,273,134, entitled "Printed Circuit Assemblies of Magnetic Cores" by H. P. Lemaire et al. There is disclosed in the patent a circuit board onto which; circuit conductors are deposited, rectangular holes are formed through the board, and magnetic core assemblies which are washer-shaped are positioned in an endwise fashion within the rectangular holes. Again, the distinctive fabrication limitation is that rectangular holes have to be formed in the circuit board. Due to the fact that the magnetic cores do not have a polarity alignment problem, there is an ease in fabricating the assembly in that the only alignment necessary is the alignment of the magnetic core with respect to the rectangular opening. Another prior art device particularly adaptable for use with printed circuit boards is disclosed in U.S. Pat. No. 3,417,294 entitled "Mounting Circuit Elements in Printed Circuit Boards" by M. Steidlitz. In that patent there is disclosed an electronic component which is cylindrical in shape and which has a segment of the cylinder wall forming at least one electrical contact. Also provided is a tab projecting from the cylinder wall, through an area not covered by the electrical contact. The tab and contact each provide at least one electrical contact to the component. Another device of interest is disclosed in Great Britain Pat. No. 1,249,108 by R. W. Beattie entitled "Electric Circuit Assemblies". In that patent there is disclosed a cylindrical electrical component having rings affixed to either end which rings are conductive in nature and which correspond in position to the electrical contacts or conductors that are fixed to the circuit board. The opening through the circuit board is cylindrical in nature and the component is designed to be inserted in the board without angular indexing.

In order to minimize the cost and to increase the effectiveness of the automatic machinery used to insert the electronic components, it appears highly desirable that the circuit boards contain easily formed apertures, namely, holes rather than rectangular and/or odd shaped apertures, particularly apertures that require key indexing which in turn requires accurate punching and- /or milling of the board. In addition, another desirable feature would be that of having the components adaptable for use in multi-layer boards, that is, where conductors which are embedded within the board at different depths can also be easily attached to the contacts of the electrical component. Another desirable feature for any automatic mounted component is to enable the component to be flow soldered into electrical contact with the conductors on the board. And to be able to remove the component from the board for circuit repair without having to destroy the board. It would also be desirable to provide an electrical component having no leads so as to minimize associated inductance.

The present invention is directed to a device which solves some of the above problems and in addition retains the advantages associated with automatic machine handling.

SUMMARY OF THE INVENTION

The present invention is directed to an electrical component particularly adapted to being mounted in a circuit board and more particularly, to a circuit board component which is formed of a cylindrical element having at least two recessed sectors in the outer surface of the cylindrical element which recessed sectors have electrically conductive material positioned therein. A flange extends from one end of the cylindrical element to provide a stopping action for the component when the component is inserted into a circuit board. Another physical feature of the invention is an index key which is affixed to one end of the component for facilitating machine alignment of the component around the axial direction so as to insure proper contact of the electrically conductive material positioned in the sectors with corresponding electrical components on the circuit board.

In one preferred embodiment of the invention the component is a capacitor wherein the cylindrical element is formed from an dielectric material which material forms the dielectric of the capacitor and the electrically conductive material positioned within the recessed sectors forms the plates of the capacitor. In such an embodiment, the surface area of the plates, the type of dielectric material and the diameter and height of the cylinder determine the value of the capacitor.

From the foregoing it can be seen that it is a primary object of the present invention to provide an improved circuit board component.

It is another object of the present invention to provide a circuit board component which is particularly adaptable to automatic machine insertion.

It is yet another object of the present invention to provide an electrical component for a circuit board, of the multi-layer type, wherein electrical contact through two or more layers of electrical conductors is facilitated.

These and other objects of the present invention will become more apparent and better understood when taken in conjunction with the following description and drawings, wherein like characters indicate like parts and which drawings form a part of the present application.

DESCRIPTION OF THE PREFERRED EMBODIMENT

Figure 1:
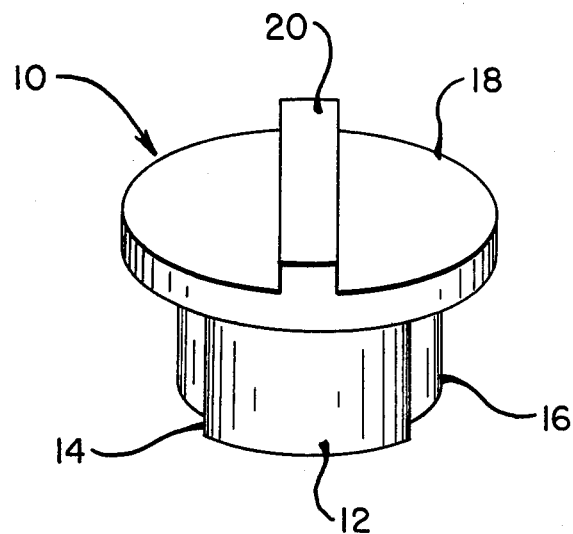
FIG. 1 is a perspective view of the preferred embodiment of the invention.
Figure 2:
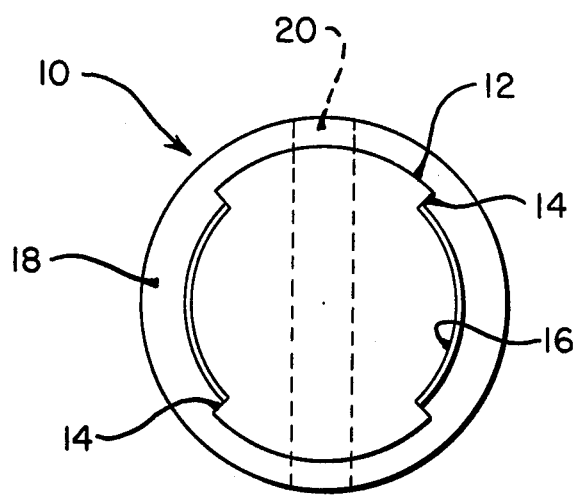
FIG. 2 is a bottom view of the preferred embodiment illustrated in FIG. 1.

Referring to FIGS. 1 and 2, the circuit board component 10 is shown comprised of a cylindrical body member 12 having recessed sectors 14 positioned on the outer surface of the cylinder and spaced apart from each other. The body member 12 is formed of a dielectric material such as Ceramic, Tantalum or Silicon. An electrical contact material 16, such as gold, aluminum, copper, tin, lead, is deposited within the recessed area 14 so as to form contacts. A flange member 18 is shown affixed to and/or formed as an integral part of the body member 12 at one end of the body member. The member 18 projects from the body member, that is, it has a larger diameter than the body member 12. Positioned atop of and/or formed integrally therewith is a key member 20 that projects upwards from the top surface of the flange member 18. The key member 20 is adapted to be received in an automatic type machine so as to index the angular position of the electrical contact material 16. In the preferred embodiment of the invention the cylindrical body member 12 has a diameter which is greater than the diameter of the recessed areas and the electrical contact material combined. This particular configuration is chosen such that a hole drilled into the circuit board having a diameter which is equivalent to the diameter of the body member 12 plus a degree of clearance will readily accept the component 10.

In one preferred embodiment of the invention the body member 12 along with the projecting member 18 and the key member 20 is formed of a dielectric material. The electrical contact area 16 is designed to have a surface area which corresponds to the area dictated by the size of a desired capacitor. The dielectric material along with the diameter of the cylindrical body when taken into consideration with the area of the electrical contact will determine the electrical characteristics of the capacitor.

Figure 3:
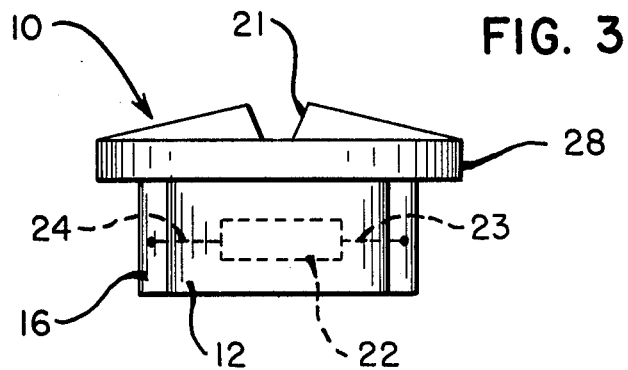
FIG. 3 is a side view of an alternate embodiment of the invention.

In FIG. 3 there is shown an alternate embodiment for the flange end member 18 and the key index. In FIG. 3 the electrical component 10 has a flange member 28 which contains a longitudinal notch 21. Notch 21 forms the key way for a machine element for angularly positioning the electrical component in a circuit board. The body member 12 may be hollowed, and an electrical component 22 such as a resistor or diode may be mounted within the body member. The leads 23 and 24 from the electrical component 22 are placed into electrical contact with the electrical contact material 16 through openings in the body member 12.

Figure 4:
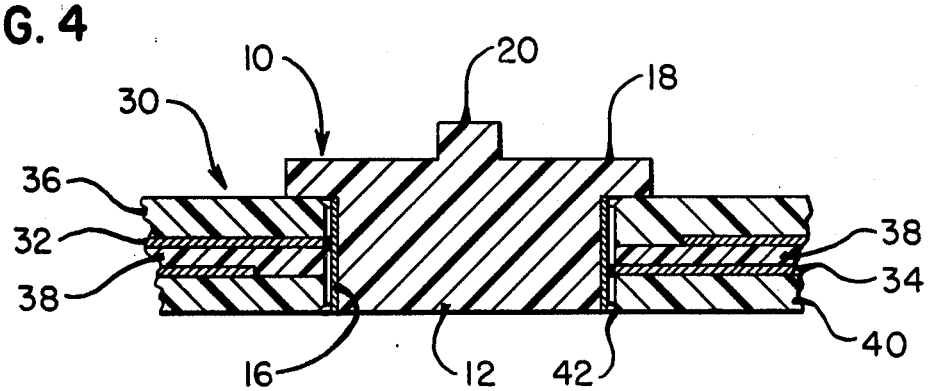
FIG. 4 is a sectioned view of a multi-layer circuit board with the preferred embodiment device illustrated in FIG. 1 inserted in place.

Referring now to FIG. 4 wherein is shown a multi-layer circuit board 30 having a first conductive layer 32 which is sandwiched between two insulating layers 36 and 38 a second conductive layer 34 is shown sandwiched between the insulating layers 38 and 40. A hole 42 is shown projecting through the circuit board, which hole has a diameter that corresponds to a slip or press fit for the body member 12 of the component 10. The key index member 20 is used to position the conductive material 16 into proper alignment with the conductors 32 and 34 in the circuit board. The space between the circuit board hole 42 and the electrical contact material 16 is normally filled by flow soldering to provide an electrical bond between the board conductors 32 and 34 and their respective component contacts 16. The flange member 18 prevents the component 10 from being pushed through the opening 42 past a preferred position.

Figure 5:
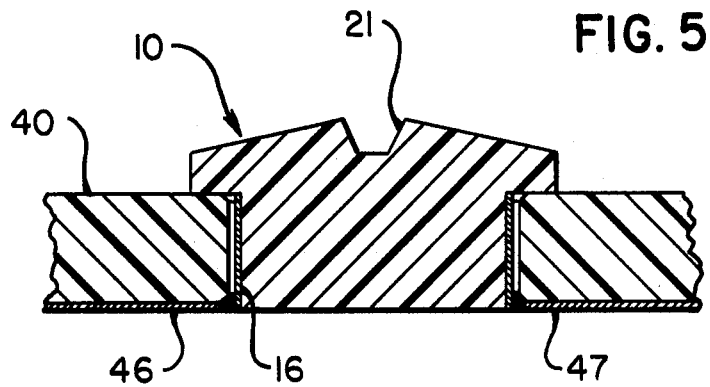
FIG. 5 is a sectioned view of a circuit board with the alternate embodiment device illustrated in FIG. 3 shown inserted in place.

Referring now to FIG. 5 wherein the alternate embodiment of the electronic component 10 which utilizes the recessed key index 21 is shown positioned on a single layer circuit board 40 having a ground lead 46 and a power lead 47. The recessed electrical contact material 16 from two different areas of the component are connected to the leads 46 and 47 respectively.

Although an electrical component of the type which has only two electrical contacts is shown for purposes of disclosing the invention, it will be obvious that with the index key arrangement of the present invention that any number of contact areas may be positioned around the cylindrical body 12 and multiple contacts made to the contact areas generally designated as 16 in the present disclosure.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A circuit board component particularly adaptable to being mounted in a circular opening through a multi-layered circuit board comprising:
    a cylindrical element having a diameter corresponding to the diameter of the circular opening through the multi-layered circuit board so as to affect a snug fit between said component and the multi-layered circuit board;
    at least two recessed sectors in the outer surface of said cylindrical element; and
    electrically conductive material positioned in said recessed sectors, said recessed sectors and said electrically conductive material being of a depth and thickness, respectively, which will facilitate the flow of an electrically conductive bonding material between said electrically conductive material and the layers of the multi-layered circuit board which are directly opposed from a respective recessed sector.

2. The circuit board component according to claim 1 and further comprising:
    a flange extending from one end of said cylindrical element to provide a stop for said component when said component is inserted into the circular opening in the multi-layered circuit board.

3. The circuit board component according to claim 1 and further comprising:
    an index key affixed to one end of said component for aligning said electrically conductive material with corresponding electrically conductive layers on the multi-layered circuit board.

4. The circuit board component according to claim 1 wherein said component is a capacitor and said cylindrical element is formed from an insulating material so as to provide the dielectric for said capacitor, and wherein said electrically conductive material forms the plates of said capacitor.

5. A circuit board component particularly adaptable to being mounted in a circular opening through a multi-layered circuit board comprising:
    an electrical component having at least two electrical contacts;
    a cylindrical body section for housing said electrical component, said cylindrical body section having a diameter corresponding to the diameter of the circular opening through the multi-layered circuit board so as to effect a snug fit between said component and the multi-layered circuit board;
    recessed surface areas on the outer surfaces of said cylindrical body section; and
    conductive material attached to said recessed surface areas and to corresponding electrical contacts on said electrical component, said recessed sections and said electrically conductive material being of a depth and thickness, respectively, which will facilitate the flow of a conductive bonding material between said electrically conductive material and the layers of the multi-layered circuit board which are directly opposed from a respective recessed sector.

6. The circuit board component according to claim 5 and further comprising:
    a flange extending from one end of said cylindrical body section to provide a stop for said component when said component is inserted into the circular opening in the multilayered circuit board.

7. The circuit board component according to claim 5 and further comprising:
    an index key affixed to one end of said cylindrical body section for aligning said conductive material with corresponding electrically conductive layers on the multilayered circuit board.

* * * * *